United States Patent [19]

Shirato

[11] 4,348,802

[45] Sep. 14, 1982

[54] PROCESS FOR PRODUCING A SEMICONDUCTOR DEVICE

[75] Inventor: Takehide Shirato, Hiratsuka, Japan

[73] Assignee: Fijitsu Limited, Kawasaki, Japan

[21] Appl. No.: 139,168

[22] Filed: Apr. 11, 1980

[30] Foreign Application Priority Data

Apr. 18, 1979 [JP] Japan .................................. 54-47417

[51] Int. Cl.³ .................. H01L 21/208; H01L 21/26; H01L 21/28
[52] U.S. Cl. ....................................... 29/571; 29/578; 29/590; 148/1.5; 148/187; 148/188
[58] Field of Search .......................... 29/571, 590, 578; 148/187, 188, 1.5

[56] References Cited

U.S. PATENT DOCUMENTS

| | | | |
|---|---|---|---|
| 3,793,721 | 2/1974 | Wakefield et al. | 29/571 |
| 3,881,242 | 5/1975 | Nuttall et al. | 148/175 X |
| 4,013,489 | 3/1977 | Oldham | 29/571 X |
| 4,039,358 | 8/1977 | Kitajima et al. | 148/187 |
| 4,109,372 | 8/1978 | Geffken | 29/590 X |
| 4,221,045 | 9/1980 | Godejahn | 29/590 X |

OTHER PUBLICATIONS

Soderman, IBM Technical Disclosure Bulletin, vol. 21, No. 3, Aug. 1978, pp. 1127 and 1128.

*Primary Examiner*—G. Ozaki
*Attorney, Agent, or Firm*—Staas & Halsey

[57] ABSTRACT

In a process for producing a semiconductor device, particularly an MIS structure semiconductor device, an electrode, which is in ohmic contact with the semiconductor substrate, is usually formed on the surface which is opposite to the surface having MIS FETs. However, in a recently developed process, the electrode mentioned above is formed on the semiconductor substrate surface on which the MIS FETs are formed, and the electrode is in ohmic contact with the substrate through a short-circuit of a PN junction formed on such semiconductor substrate surface. However, a so formed electrode is liable to break. In the present invention, wherein a masking layer covers the substrate-contact region during the production of the MIS FETs, the electrode mentioned above is in an ohmic contact with the electrode not through the PN junction and the problem of breaking occurs seldom.

13 Claims, 26 Drawing Figures

PROCESS FOR PRODUCING A SEMICONDUCTOR DEVICE

BACKGROUND OF THE INVENTION

1. Field of the Invention

The present invention relates to a process for producing a semiconductor device, more particularly, a process for the formation of a contact electrode which is to be placed in ohmic contact with the semiconductor substrate of a semiconductor device, particularly an MIS structure semiconductor device.

2. Description of the Prior Art

In MIS structure semiconductor devices, such as an MOS field effect transistor (MOS FET) and an MOS integrated circuit (MOS IC), the semiconductor substrate must be connected to a ground potential or a back gate bias potential. An MIS structure semiconductor device is, therefore, always provided with a terminal for electrically connecting a current source of a ground potential or a back gate bias potential with the semiconductor substrate. However, the connection of the terminal with the semiconductor substrate, which is formed at the outermost part of the semiconductor device, is sometimes difficult for the reasons explained hereinafter.

FIG. 1 is a cross sectional view of an essential part of a conventional MIS structure semiconductor device. Referring to FIG. 1, a semiconductor element 1 comprises a semiconductor substrate 2 and an insulating film 3 formed on the front surface of the semiconductor substrate 2. A terminal 4 is formed on the insulating film 3 and is used to apply a back gate bias potential or a ground potential to the semiconductor substrate 2. The terminal 4 is hereinafter referred to as a ground terminal. The semiconductor element 1 is mounted on a ceramic package 5. The ceramic body 6 of the package 5 is provided with a metallic layer 8, such as a metallized layer or a molybdenum sheet. The semiconductor substrate 1 is ohmically bonded to the metallic layer 8 through the rear surface of the substrate and a soldering layer 11. A fine wire 9 of, for example, gold is connected between the metallic layer 8 and a terminal 10, hereinafter referred to as an external terminal 10. In addition, a fine wire 9' is connected between the external terminal 10 and the ground terminal 4.

In the structure of the MIS semiconductor device of FIG. 1, the bonding position of the fine wire 9 with the metallic layer 8 should be so selected that the soldering material of the layer 11 does not flow to the bonding position. In addition, there is a considerable difference in height between the bonding positions of the fine wire 9' and the fine wire 9. Because of the facts concerning the bonding position and the height difference mentioned above, the bonding operation is difficult and bonding of wires, particularly fine wires, using an automatic bonding machine is difficult.

It has been proposed in the prior art to ohmically connect the ground terminal mentioned above to a semiconductor substrate and, hence, to eliminate the necessity of the fine wire 9 indicated in FIG. 1. A contact process illustrated by FIGS. 2A through 2F is a variation of the proposed process. FIGS. 2A through 2F are cross sectional views of parts of an N channel MOS IC. In FIG. 2A, on a P type silicon (Si) substrate 2, the borders of a substrate contact region 22 and a semiconductor element region 23 are defined by a field oxide film 21. The semiconductor element region 23 and substrate contact region 22 are separated from each other by the field oxide film 21. A gate oxide film 24 and a gate electrode 25 made of polycrystalline silicon are formed on the semiconductor element region 23.

In FIG. 2B, a photoresist 51 is applied on the P type semiconductor substrate 2 and, then, left on the substrate-contact region 22 by a conventional photolithographic technique. Impurities are implanted by an ion implantation technique using the gate oxide film 24 and the gate electrode 25 as a mask, as illustrated by arrows, so as to form an N+ type source region 27 and an N+ type drain region 27'. However, instead of the ion implantation technique, a diffusion technique can be used for the formation of the source and drain regions. When the diffusion technique is used, an oxide film is formed on the substrate-contact region 22 and the semiconductor-element region 23, and polycrystalline silicon is delineated into a gate electrode 25. Subsequently, a photoresist is formed and delineated as indicated in FIG. 2B (c.f. 51) and, then, the oxide film is removed by etching so as to expose parts of the semiconductor element region where the source and drain regions are later formed. Diffusion of the impurities is carried out so as to form the N+ type source region 27 and N+ type drain region 27', while leaving the oxide film on the substrate-contacting region 22.

After the formation of the source and drain regions as explained above, a phosphosilicate glass (PSG) layer 26 (FIG. 2C) is formed on an oxide film 41 for suppressing the diffusion of phosphorus from the PSG layer 26. The PSG layer 26 and the oxide film 41 are selectively removed by an etching technique so as to form apertures 28, 28' and 28" (FIG. 2D) for exposing the substrate-contact region 22, the source region 27 and the drain region 27', respectively.

Subsequently, an oxide film 42 is formed on the regions exposed in the apertures 28, 28' and 28" as indicated in FIG. 2E. The oxide film 42 prevents the formation of PN junctions on the exposed regions mentioned above due to out-diffusion of phosphorus in the PSG layer 26 into these regions. Such out-diffusion occurs during a heat treatment which will be explained with reference to FIG. 2F. The heat treatment is carried out so as to control the diffusion or ion-implanted depth of the source and drain regions, and also to melt and round the edges of the PSG layer 26 indicated in FIG. 2D. The oxide film 42 is then removed and contact electrodes of aluminum 32, 32' and 32" and polycrystalline silicon 30, 30' and 30" are formed as indicated in FIG. 2F.

In the process as explained with reference to FIGS. 2A through 2F, the formation of the oxide film 42 is indispensable, and the heat treatment for the oxide film formation deepens the source and drain regions. This process is, therefore, not suitable for the formation of shallow source and drain regions.

Another variation of the known process is illustrated in FIG. 3. A substrate-contact electrode is prepared by short circuiting a PN junction in this variation. An N channel MOS IC illustrated in FIGS. 3 and 4A–C comprises a p type silicon substrate 2, a gate insulating film 12, a gate electrode 13 made of polycrystalline silicon, a PSG layer 14, an N+ type source region 15, an N+ type drain region 15', a source electrode 16 made of aluminum and a drain electrode 16' made of a lower layer of polycrystalline silicon and an upper layer of aluminum. The source electrode 16 is ohmically in contact with the silicon substrate 2, because there is no underlying polycrystalline silicon, and further, molten aluminum of the source electrode 16 easily penetrates through the PN junction between the source region 15 and the silicon substrate 2 during a heat treatment for melting the aluminum. A layer 17 containing a high concentration of aluminum is formed due to the aluminum penetration and, therefore, the source electrode 16 is ohmically in contact with the silicon substrate. A substrate-contact electrode is, therefore, produced by the source electrode 16.

The process explained above with reference to FIG. 3, however, involves a problem in causing a discontinuity in the aluminum layer of the source electrode 16, and the MOS IC produced by variation of the process is not reliable in practical use.

Referring to FIGS. 4A through 4C, illustrating the occurrence of the discontinuity mentioned above, a polycrystalline silicon layer 18 is deposited on the surface of silicon substrate 2 including the surface of the source region 15 and the drain region 15'. Thereafter, a photoresist film 19 is selectively formed on the polycrystalline silicon layer 18 so as to expose a region of the layer 18 for the formation of the electrode which is in ohmic contact with the substrate, for example, a region of the layer 18 above the source region 15. The polycrystalline silicon layer 18 is then removed by a plasma etching technique using the photoresist film 19 as a mask. In the removal of the polycrystalline silicon layer 18, it is extremely difficult to precisely terminate the plasma etching at the completion of such removal. The surface of the silicon substrate 2 is, therefore, deeply etched away as illustrated in FIG. 4B, and a concavity 20 is caused to form. When the aluminum layer of the source electrode 16 is deposited on the deeply etched surface of the silicon substrate, the aluminum layer is extremely thin at the vertical wall portions of the concavity 20 as indicated in FIG. 4C and is, therefore, very likely to break.

The reason for formation of the concavity 20 will now be explained. Just before the plasma etching of the polycrystalline silicon layer 18 is completed the exposed polycrystalline silicon layer 18 remains only on the surface of the source region. The surface area of the polycrystalline silicon layer 18 is, therefore, considerably reduced at a time close to completion of the etching as compared to that at the beginning of the plasma etching. Since the plasma etching rate in the vertical direction of a polycrystalline silicon layer is high when the surface area thereof is small, the polycrystalline silicon layer is rapidly and deeply etched in a short period of time. It is, therefore, impossible to precisely terminate the plasma etching when the removal of the polycrystalline silicon layer 18 is completed. Consequently, the concavity 20 is formed. The tendency to form the concavity is especially conspicuous in the so called selective oxidation process used for MOS ICs and MOS LSIs. In the selective oxidation structures, a thick field oxide film 21 is formed by thermal oxidation. The substrate-contacting region and the MOS FET are isolated from each other by an insulation-isolation of the field oxide film 21. In the thermal oxidation, a thick oxide film 21' is formed on the surface of the silicon substrate opposite to the surface, where MOSFETs are formed, and remains on this opposite surface until the final step of producing the MOS ICs. Accordingly, the surface area of the silicon exposed to the plasma gas is very small and, hence, the tendency to form the concavity is conspicuous in the production of the MOS ICs and MOS FETs having the selective oxidation structure. An electrode which is in ohmic contact with a semiconductor substrate from an upper-surface of an MIS structure semiconductor device is hereinafter simply referred to as a substrate-contact electrode.

SUMMARY OF THE INVENTION

It is an object of the present invention to improve prior art processes for forming a substrate-contact electrode to the extent of preventing the discontinuity of the substrate-contact electrode during the production of an MIS structure semiconductor device having especially a selective oxidation structure.

It is another object of the present invention to produce a substrate-contact electrode in an MIS structure semiconductor device, in which the depth of the PN junction between the source or drain region and the substrate is required to be shallow.

The present invention is characterized by an ohmic connection of a substrate-contact electrode with a semiconductor substrate not through a PN junction but in a separate contact region of the semiconductor substrate.

In accordance with the objects of the present invention, there is provided a process for producing a semiconductor device comprising the steps of:

defining, on a semiconductor substrate, borders of at least one semiconductor element region and at least one substrate-contact region;

forming on said semiconductor element region at least one layer of a material which constitutes a part of a semiconductor element;

forming on said substrate-contact region a masking layer consisting of said material;

completing at least one semiconductor element at each of said semiconductor element regions, and;

thereafter, removing said masking layer and forming on said substrate contact region a contact electrode which is ohmically connected to said semiconductor substrate.

A process for forming an N channel MIS structure semiconductor device comprising the steps of:

defining on a P conductivity type silicon substrate borders of at least one N channel MIS field effect transistor region and at least one substrate-contact region;

forming on the P conductivity type silicon substrate a material layer of a gate insulating film of the N channel MIS field effect transistor and, then, a material layer of a gate electrode;

defining a border of a gate region and a masking layer of the substrate-contact region by selective removal of the material layers of the gate insulating film and the gate electrode;

introducing N conductivity type impurities into portions of the P conductivity type silicon substrate exposed in the neighborhood of said gate region, thereby forming an N conductivity type source region and an N conductivity type drain region in each of the N channel MIS field effect transistor regions;

removing the masking layer to thereby expose the substrate-contact region, and;

forming an electrode, which is in ohmic contact with the P conductivity type silicon substrate, on the exposed substrate-contact region, and an electrode on each of the N type source and drain regions.

A process for forming a P channel MIS structure semiconductor device comprises the steps of:
- defining on an N conductivity type silicon substrate borders of at least one P channel MIS field effect transistor region and at least one substrate-contact region;
- forming on said N conductivity type silicon substrate a material layer of a gate insulating film of the P channel MIS field effect transistor and, then, a material layer of a gate electrode;
- defining a border of a gate region and a masking layer of the substrate-contact region by selective removal of the material layers of the gate insulating film and the gate electrode;
- introducing P conductivity type impurities into portions of the N conductivity type silicon substrate exposed in the neighborhood of said gate region, thereby forming a P conductivity type source region and P conductivity type drain region in each of the P channel MIS field effect transistor regions;
- removing the masking layer to thereby expose the substrate-contact region;
- introducing N conductivity type impurities into the exposed substrate contact region, while preventing the introduction of the N conductivity type impurities into the P type source and drain regions; and
- forming an electrode, which is in ohmic contact with the N conductivity type silicon substrate, on the exposed substrate-contact region, and an electrode on each of the N type source and drain regions.

BRIEF DESCRIPTION OF THE DRAWINGS

The present invention is hereinafter explained with reference to embodiments of the present invention illustrated in FIGS. 5A through 6E.

DETAILED DESCRIPTION OF THE PREFERRED EMBODIMENTS

Figure 5A:
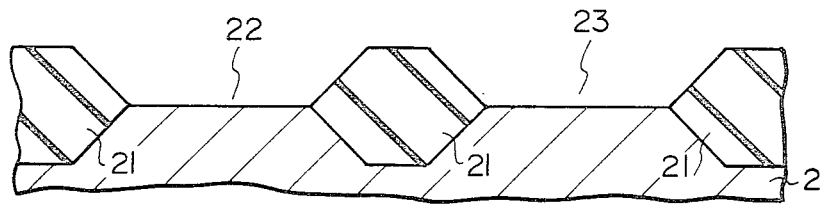
FIGS. 5A through 5J depict an essential part of an N channel MOS IC and illustrate an embodiment of the process according to the present invention.
Figure 5B:
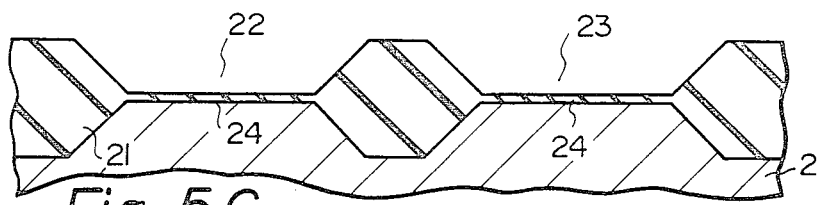

Referring to FIG. 5A a field oxide film 21 is formed by a known selective oxidation method on the surface of a P type silicon substrate 2. The field oxide film 21 is used for a surface passivation, and defines the borders of a substrate-contact region 22 and a semiconductor-element region 23, and isolates these regions from each other.

Silicon of the substrate-contact region 22 and the semiconductor-element region 23 is subjected to a thermal oxidation and a silicon dioxide film 24 having a thickness of from 400 to 700 Å is formed on these regions. This silicon dioxide film is hereinafter referred to as a gate- and masking-oxide film 24.

Figure 5C:
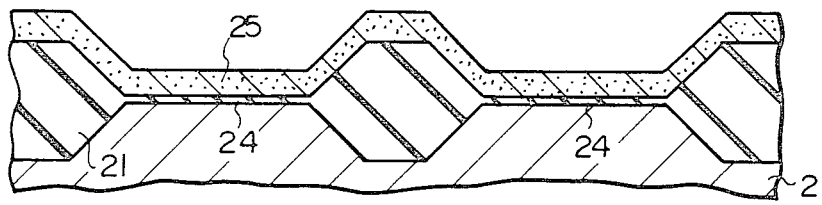

Referring to FIG. 5C a polycrystalline silicon layer 25 is deposited on the silicon substrate 2 by a chemical vapor deposition (CVD) method to a thickness of from 4000 to 5000 Å. The polycrystalline silicon layer is hereinafter referred to as a gate electrode- and masking-polycrystalline silicon layer 25.

Figure 5D:
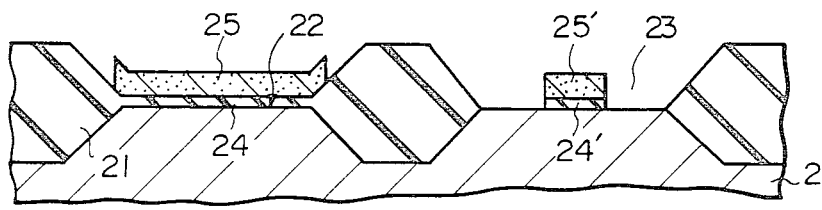

Next, referring to FIG. 5D, the gate electrode- and masking-polycrystalline silicon layer 25 and the gate- and masking-oxide film 24 are selectively removed. A plasma etching is used to selectively remove the gate electrode- and masking-polycrystalline silicon layer 25 and an etching solution comprising HF is used to selectively remove the gate- and masking-oxide film 24. As a result of the selective removal, parts of the semiconductor-element region 23 are exposed and parts of the gate- and masking-oxide film 24 and the gate electrode- and masking-polycrystalline silicon layer 25 remain on the semiconductor element-region 23. The remaining gate- and masking-oxide film 24 on the region 23 is denoted by reference numeral 24' and hereinafter referred to as a gate oxide film 24'. The remaining gate electrode- and masking-polycrystalline silicon layer 25 on the region 23 is denoted by reference numeral of 25' and hereinafter referred to as a gate electrode 25'. On the other hand, the gate electrode- and masking-polycrystalline layer 25 covers the substrate contact region 22 and the ends of this layer 25 extend to the surface of the field oxide film 21.

Figure 5E:
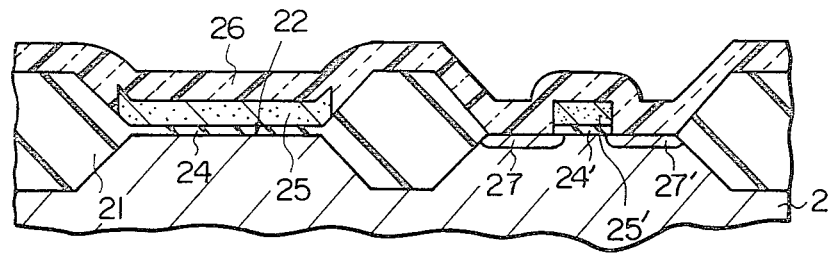

A PSG layer 26 (FIG. 5E) is formed on the entire surface over the silicon substrate 2 to a thickness of, for example, approximately one micron by means of a known CVD process. The PSG layer 26 is used for the diffusion source of phosphorus and the phosphorus is diffused into the surface of the silicon substrate 2. As a result of the diffusion, the N+ type source region 27 and the N+ type drain region 27' are formed as illustrated in FIG. 5E. During the diffusion, the phosphorus is introduced into the polycrystalline silicon of the gate electrode 25' and the gate electrode- and masking-polycrystalline silicon layer 25, and can be incorporated into the gate oxide film 24' and the gate- and masking-oxide film 24. Accordingly, the gate electrode 25' is caused to be conductive. The gate electrode- and masking-polycrystalline silicon layer 25 and the gate- and masking-oxide film 24 prevent incorporation of the phosphorus into the substrate contact region. Instead of the diffusion technique, an ion implantation technique may be used for the formation of the source and drain regions.

Figure 5F:
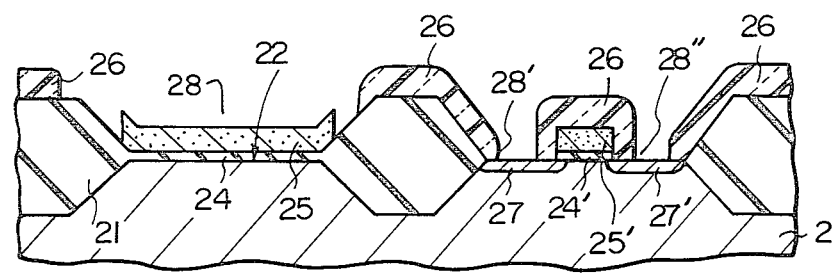

Referring to FIG. 5F, the PSG layer 26 is selectively removed by a conventional photolithographic technique, so as to form apertures 28, 28' and 28", which expose the portion of the gate electrode- and the masking-polycrystalline layer 25 at the substrate contact region 22, the source region and the drain region, respectively. Subsequently, the PSG layer 26 is subjected to a heat treatment for smoothing the edges thereof. Instead of the selective removal of the PSG layer 26, the PSG layer 26 may not be removed after the formation of the source and drain regions until the gate electrode- and masking-polycrystalline silicon layer 25 and the gate- and masking-oxide film 24 are later removed.

The steps of the formation of the semiconductor element is completed with the smoothing mentioned above or the formation of the source and drain regions.

Figure 5G:
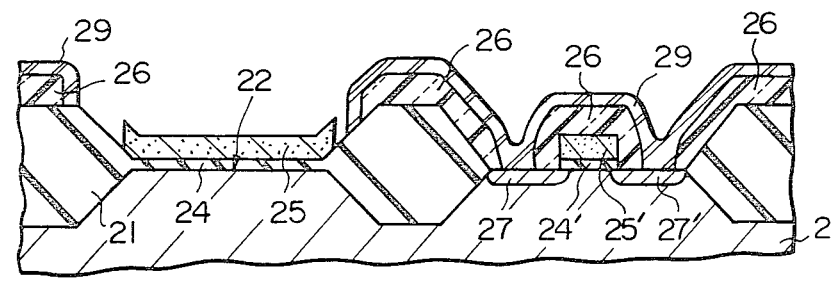
Figure 5H:
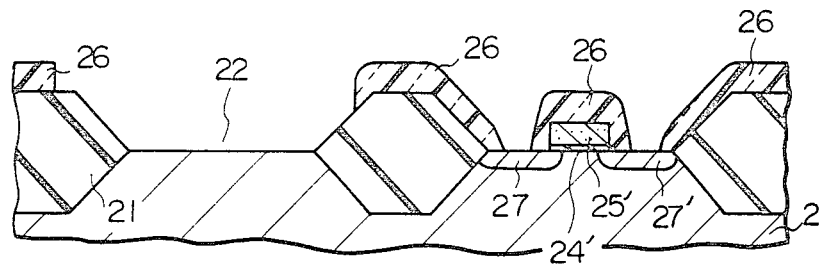

Electrodes are formed as illustrated hereinafter. Referring to FIG. 5G, a photoresist film 29 is selectively formed over the silicon substrate 2, so that the substrate-contact region 22 is exposed by an aperture of the photoresist film 29. This aperture is larger than the gate electrode- and masking-polycrystalline silicon layer 25. The gate electrode- and masking-polycrystalline silicon layer 25 covering the substrate-contact region 22 is removed by plasma etching using the photoresist film 29 as a mask. The gate- and masking-oxide film 24 is then removed by an etching agent containing hydrofluoric acid using the photoresist film 29 as a mask. Accordingly, the substrate-contact region 22 and the source and drain regions 27 and 27' are exposed as illustrated in FIG. 5H.

Figure 5I:
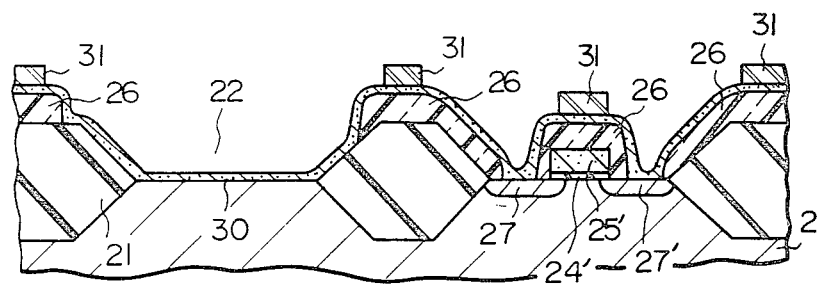

Referring to FIG. 5I, a polycrystalline silicon layer 30, hereinafter referred to as a masking polycrystalline silicon layer 30, is deposited entirely on the silicon substrate 2 to a thickness of, for example, approximately 400 Å, and then, a photoresist film 31 is selectively formed on a portion of the masking polycrystalline silicon layer 30 to be removed in the step explained hereinafter.

Figure 5J:
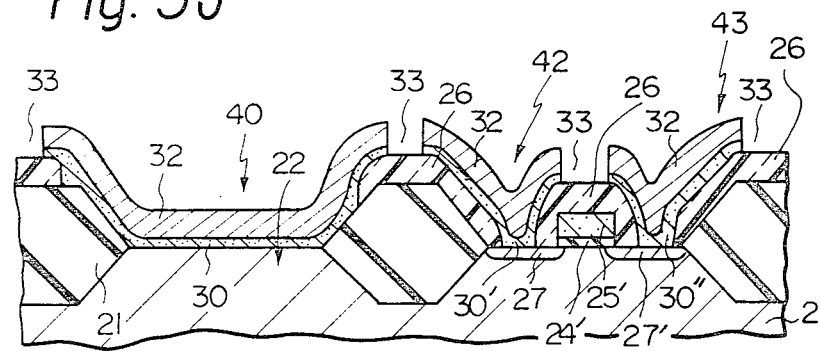

Referring to FIG. 5J, an aluminum layer 32 is deposited by an evaporation method on the layers and films, including the photoresist film 31 (not shown in FIG. 5J), on the silicon substrate 2 to a thickness of, for example, approximately one micron. Subsequently, the photoresist film 31 is removed simultaneously with the removal of the aluminum layer 32 thereon by a so called lift off process, with the result that the aluminum layer 32 is divided into separate parts by grooves. The masking polycrystalline silicon layer is then selectively removed by a plasma etching technique using the separated aluminum layer 32 as a mask. A mixture of carbon tetrafluoride ($CF_4$) and oxygen ($O_2$) is used as a plasma source gas. As a result of the plasma etch gas, the masking polycrystalline silicon layer is divided into separated parts 30, 30', 31'' by separation grooves 33. The aluminum layer 32 and the masking polycrystalline silicon layer 30 on the substrate-contact region 22 are denoted in FIG. 5J by reference numeral of 40 and constitute the substrate-contact electrode 40. A source electrode 42 and a drain electrode 43 are formed as indicated in FIG. 5J. The borders of the substrate-contact electrode 40, the source electrode 42 and the drain electrode 43 are defined by the separation grooves 33. After the formation of the electrodes 40, 42 and 43, the silicon substrate 2 with the films and layers thereon is heat treated in a hydrogen-containing atmosphere, at a temperature of approximately 450° C., for a period of approximately 30 minutes. As a result of the heat treatment, the aluminum of the aluminum layer 32 and the silicon of the masking polycrystalline silicon layer are brought into reaction with each other to form an aluminum silicide which has an electric property of forming an ohmic contact between the electrodes 40, 42 and 43 and the silicon substrate 2.

Figure 1:
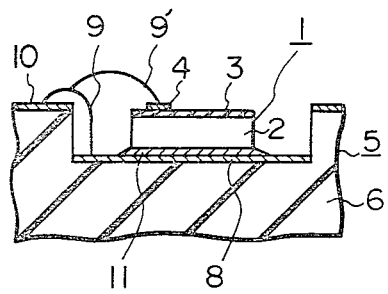
FIG. 1 shows a cross-section prior art contact to a semiconductor substrate.
Figure 3:
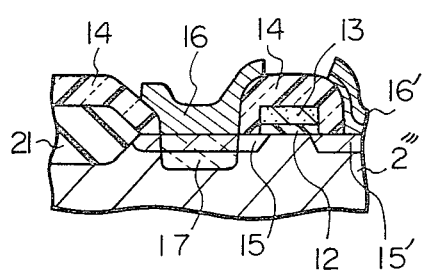
FIG. 3 shows another variation of the known process for connecting to the substrate.
Figure 4A:
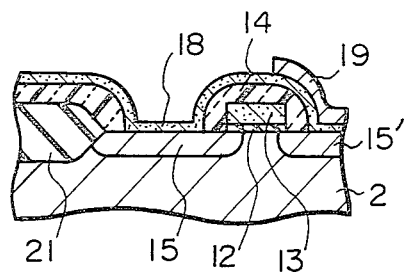
FIGS. 4A to 4C show a disadvantage of another prior art process for connecting to the substrate.
Figure 4B:
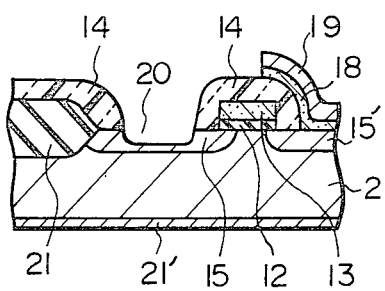
Figure 4C:
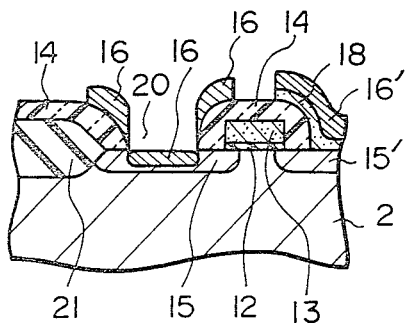
Figure 2A:
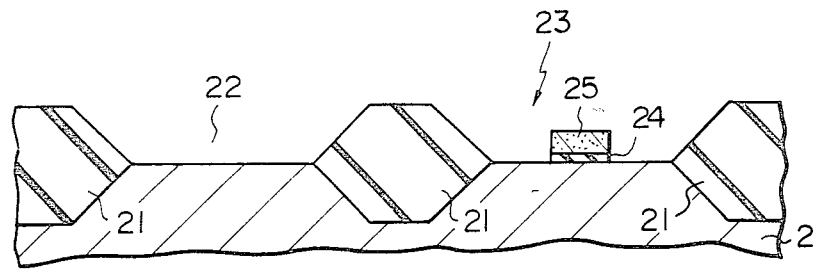
FIGS. 2A through 2F show a variation of a prior art process for connecting to the substrate.
Figure 2B:
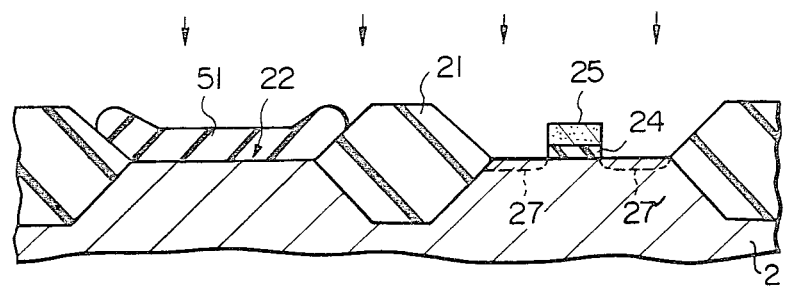
Figure 2C:
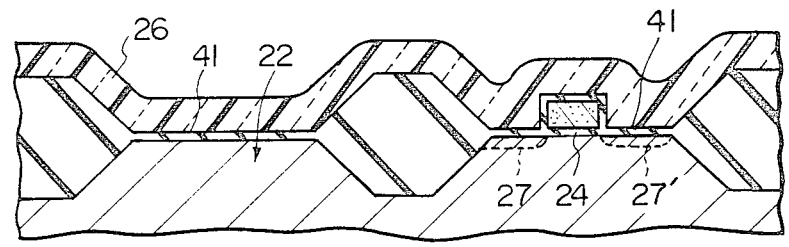
Figure 2D:
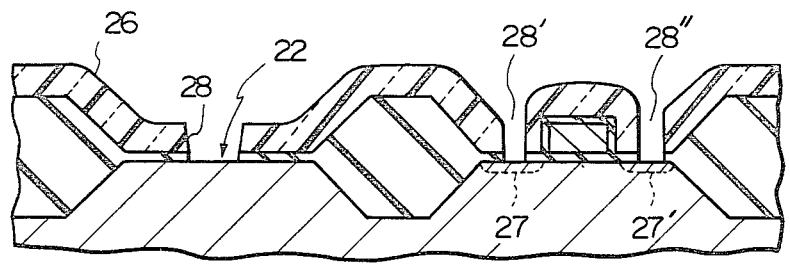
Figure 2E:
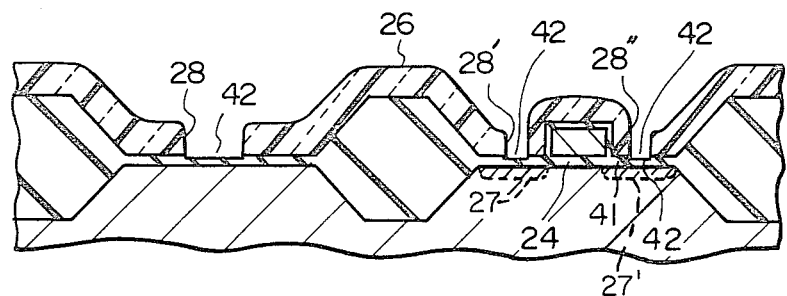
Figure 2F:
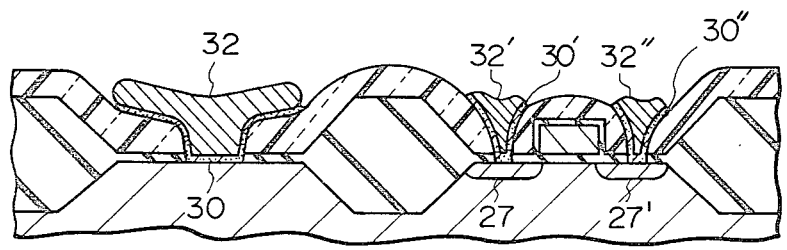

In the steps illustrated in FIG. 5, one element of an N channel MOS IC is completed. As will be understood from the explanation of the production steps, the substrate-contact region is masked by the gate- and masking-oxide film 24 and the gate electrode- and masking-polycrystalline silicon film 25, and these films 24 and 25 are formed simultaneously with the formation of parts of the MOS FET, i.e., the gate oxide film and the gate electrode of the MOS FET. In addition, the substrate-contact electrode 40, the source electrode 42 and the drain electrode 43 are formed simultaneously. Accordingly, it is not necessary to increase the production steps in the present invention over the production steps of the conventional process for producing the N channel MOS ICs. Furthermore, since in the present invention the gate- and masking-oxide film 24 acts as an etching impeding mask of the silicon substrate 2 during plasma etching of the overlying gate electrode- and masking polycrystalline silicon film 25, the concavity 20 (FIG. 4B), which is formed in the prior art method illustrated in FIGS. 4A, 4B and 4C, is not formed at all. Accordingly, the masking polycrystalline silicon layer 30 and the aluminum layer 32 do not easily break. The N channel MOS ICs having the substrate-contact electrode, are therefore, very reliable in operation. Furthermore, in the present invention, the heat treatment for realizing the ohmic contact is usually required. The temperature of this heat treatment is, for example, approximately 500° C., and hence, is low compared with the diffusion temperature. Accordingly, the depth and width of the diffusion layers of the source and drain regions are increased negligibly as compared to the heat treatment for the diffusion. As a result, it is possible to produce MOS ICs having shallow source and drain regions and a high integration degree. The substrate contact electrode mentioned above may be an electrode which is in contact with parts of a semiconductor element, such as a MOS FET and a resistor, or an electrode which is connected to the ground potential or back gate bias potential. In addition the substrate contact electrode includes a conductor extending from the electrodes mentioned above to a predetermined portion ($V_{SS}$, $V_{BB}$) of the MOS ICs and MOS LSIs on an insulating film.

In FIGS. 6A through 6E the essential part of a P channel MOS IC is illustrated. In the production of the P channel MOS ICs an N type silicon substrate is used. However, when the resistivity of the N type silicon substrate is high, it is difficult to form an ohmic contact between the N type substrate and a conductive material. Impurities having the same conductivity type as the substrate are introduced into a substrate-contact region, thereby facilitating the establishment of the ohmic contact. In order to conduct the impurity introduction, the sequence of a few production steps of the N channel MOS IC (FIG. 5) are interchanged as explained hereinafter.

Figure 6A:
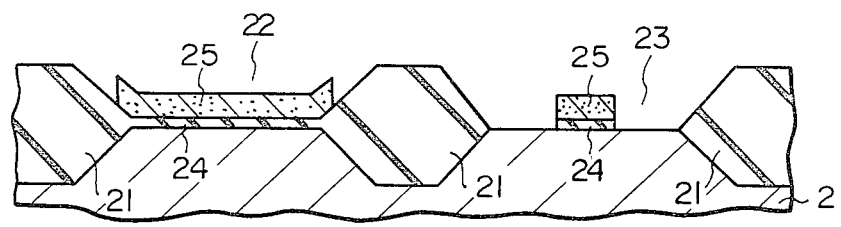
FIGS. 6A through 6E depict an essential part of a P channel MOS IC in another embodiment of the present invention.
Figure 6B:
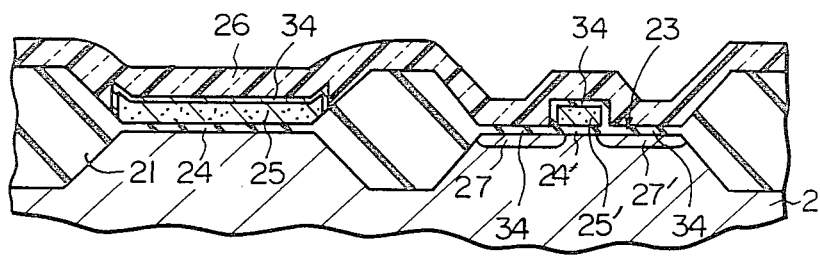

FIG. 6A depicts the production step which is the same as the step in FIG. 5D. Until this step, the N type silicon substrate 2, hereinafter simply referred to as a silicon substrate 2, may be subjected to the same production step as in the production of the N channel MOS IC.

Subsequently, P type impurities, such as boron, are implanted into a semiconductor element region 23 (FIG. 6B) by an ion implantation technique, thereby forming a source region 27, which has a P type conductivity, and a drain region 27', which has P type conductivity. A silicon dioxide film 34 is then formed by a thermal oxidation technique on the source region 27 and the drain region 27'. In this thermal oxidation process, the silicon dioxide film 34 is formed on the gate electrode- and masking-polycrystalline silicon layer 25 and the gate electrode 25'. Subsequently, a PSG layer 26 is deposited by a CVD process over the entire silicon substrate 2. The formation of a semiconductor element is completed by the steps explained above.

Figure 6C:
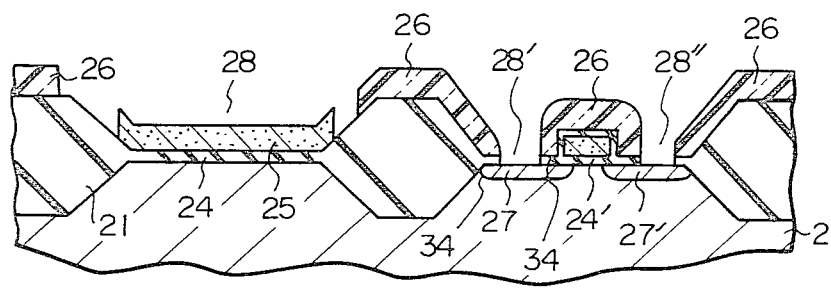

Referring to FIG. 6C, the PSG layer 26 and, then, the silicon dioxide film 34 are selectively removed, so as to form apertures 28, 28' and 28'' which expose the gate electrode- and masking polycrystalline silicon film 25 in the substrate contact region, the source region 27 and the drain region 27'. A thin silicon oxide film (not shown) is formed by oxidation on the source region 27 and drain region 27' exposed within respective apertures.

Figure 6D:
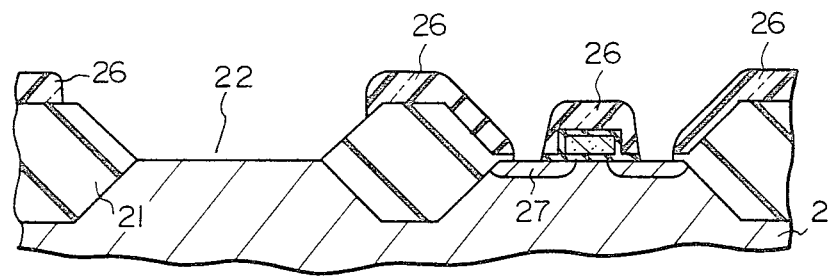
Figure 6E:
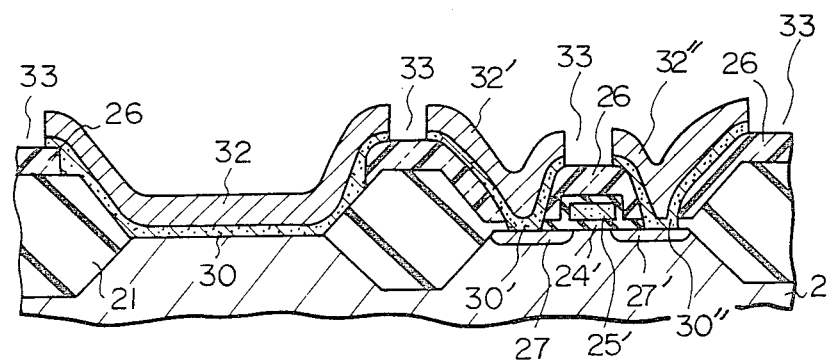

Referring to FIG. 6D, the gate electrode- and masking-polycrystalline silicon layer 25 and the gate- and masking-oxide film 24 on the substrate-contact region 22 are removed, so as to expose the silicon substrate 2. This removal can be conducted by the same process as explained in the production of the N channel MOS IC. Simultaneously with the melting of the PSG layer 26 and, hence, the smoothing of the edges thereof, the phosphorus in the PSG layer 26 is caused to diffuse into the substrate-contact region 22. The PSG layer 26 is, therefore, used as a source of the phosphorus diffusion which increases the concentration of phosphorus at the surface of the silicon substrate 2. The ohmic contact with the silicon substrate 2 is facilitated by the phosphorus diffusion into the substrate-contact region 22. During this phosphorus diffusion, the phosphorus is not incorporated into the source and drain regions 27 and 27', respectively, because the (not shown) thin silicon oxide film mentioned above is formed on these regions. Subsequent to the phosphorus diffusion, this thin silicon oxide film is removed and, then, the electrodes are formed as explained with regard to the production of the N channel MOS IC. When the P channel MOS IC and N channel MOS IC produced by the present invention are compared, the depths of the source and drain regions in the P channel MOS IC are deeper than those in the N channel MOS IC, due to the phosphorus diffusion explained above. This is because a thermal oxidation step is necessary in the production of the P channel MOS IC, so as to prevent the phosphorus diffusion into the source and drain regions by the thin silicon oxide film.

It will be understood from the explanation above that a PN junction is not formed at the substrate-contact region in the P and N channel MOS ICs of the present invention. The PN junction is not formed because the substrate-contact region is masked during the production of the semiconductor element, namely an MOS FET. The advantages provided by the present invention are mainly that: the reliability of the MIS structure semiconductor devices produced by the present invention is high, because breaking of the electrodes during the selective etching of the electrodes does not occur; the production process is not greatly modified from the prior art method of producing the MIS structure semiconductor device; and the process according to the present invention can be utilized for the production of MIS structure semiconductor devices having various structures, such as a selective oxidation structure.

The electrodes mentioned above are made of aluminum and polycrystalline silicon. However, the electrodes of the present invention are not restricted to these materials, and may be made of molybdenum (Mo) and other high melting point metals. In addition, the electrodes are prepared by depositing, firstly, a polycrystalline silicon by CVD and, secondly, aluminum by evaporation in the processes explained with reference to FIGS. 4 and 5A–J. However, a sputtering technique can be used, and an aluminum silicide and other silicides may be deposited on the silicon substrate by the sputtering. In addition, instead of aluminum, titanium (Ti), gold (Au), platinum (Pt) and other conventional electrode materials may be deposited on the polycrystalline silicon layer. The insulating layer of the masking layer is the gate- and masking oxide film in the embodiments mentioned above, but may be a single layer or plurality of layers of silicon nitride and alumina, in addition to the silicon dioxide.

A single substrate-contact electrode is illustrated, however, one semiconductor element may obviously be provided with a plurality of the substrate-contact electrodes. In this regard, a plurality of the substrate-contact electrodes are desirable in the MOS ICs and MOS LSIs.

The following are the preferable approximate thicknesses of the layers and films of P and N channel MOS ICs.

| | |
|---|---|
| Aluminum layer | 1 micron |
| Masking polycrystalline silicon layer 30 | from 400 to 500 Å |
| PSG layer 26 | 1 micron |
| Field oxide film 21 | 7000 Å |
| Gate electrode 25' | 4000 Å |
| Gate oxide film 24' | from 400 to 700 Å |

The area of the substrate contact region 22 is preferably from 2 microns×2 microns to 3 microns×3 microns. The area of each of the apertures 28, 28' and 28" is preferably 2 microns×2 microns.

I claim:

1. A process for producing a semiconductor device with shallow doped regions in a substrate and at least one substrate contact, said process comprising the steps of:

defining on said semiconductor substrate borders of at least one semiconductor element region wherein said shallow doped regions are to be formed and at least one substrate-contact region;

forming on each said semiconductor element region at least one layer of a material which is comprised in a part of a semiconductor element, this part being located on the surface of said substrate, and simultaneously forming on said at least one substrate-contact region masking layer consisting of said material;

doping each said shallow region while preventing the doping of said substrate contact-region by use of said masking layer; and thereafter, removing said masking layer and forming on each said substrate-contact region a contact electrode which is ohmically connected to said semiconductor substrate.

2. A process according to claim 1, wherein said semiconductor element is an MIS structure field effect transistor.

3. A process according to claim 2, wherein said masking layer consists of the materials of the gate insulating film and the gate electrode of said MIS structure field effect transistor.

4. A process according to claim 2 or 3, wherein said border defining step comprises selectively forming a field insulation film.

5. A process according to claim 4, wherein, in said masking layer forming step, the material of said masking layer is selectively removed, so that said masking layer extends to the surface of said field insulation film.

6. A process for forming an N channel MIS structure semiconductor device comprising the steps of:

defining on a P conductivity type silicon substrate borders of at least one N channel MIS field effect transistor region and at least one substrate-contact region;

forming on said substrate a material layer of a gate insulating film of said transistor and, then, a material layer of a gate electrode of said transistor;

simultaneously defining the borders of a gate region in each said transistor region and of a masking layer for said substrate-contact region by selective removal of said material layers, thus exposing selected portions of said substrate adjacent to said gate region while covering said substrate-contact region;

introducing N conductivity type impurities into said exposed portions of said substrate adjacent to said gate region to form N conductivity type source and drain regions in each said transistor region;

removing said masking layer to thereby expose each said substrate-contact region; and forming an electrode, which is in ohmic contact with said substrate on said exposed substrate-contact region and an electrode on each of said source and drain regions.

7. A process for forming a P channel MIS structure semiconductor device comprising the steps of:

defining on an N conductivity type silicon substrate borders of at least one P channel MIS field effect transistor region and at least one substrate-contact region;

forming on said substrate a material layer of a gate insulating film of said transistor and, then, a material layer of a gate electrode of said transistor;

defining the borders of a gate region of said transistor and of a first masking layer for said substrate-contact region by selective removal of said material layers, thus exposing selected portions of said substrate adjacent to said gate region;

introducing P conductivity type impurities into the portion of said substrate exposed around said gate region, thereby forming P conductivity type source and drain regions in each of said transistor regions;

forming a second masking layer to cover said source and drain regions and removing said first masking layer to thereby expose each said substrate-contact region;

introducing N conductivity type impurities into each said exposed substrate-contact region, while preventing the introduction of said N conductivity type impurities into said source and drain regions by means of said second mask; and forming an electrode in ohmic contact with said substrate on said exposed substrate-contact region and an electrode on each said source and drain region.

8. The process of claim 6 or 7, said step of defining said borders of each said transistor region and substrate-contact region comprising selectively forming a field oxide film on said substrate.

9. The process of claim 8, said defining of said borders of each said substrate-contact region comprising forming said material layers to extend at least to the sides of said field oxide film defining said borders of each said substrate-contact region.

10. The process of claim 2, 3, 6 or 7, comprising forming electrodes for the drain and source regions of each said transistor simultaneously with forming each said contact electrode.

11. The process of claim 3, said substrate being a silicon substrate, said gate insulating film comprising silicon oxide and said gate electrode comprising polycrystalline silicon, and said border defining step comprising selectively forming a field insulation film of silicon oxide on the exterior portions of each said semiconductor element region and substrate-contact region.

12. The process of claim 7, said second masking layer comprising a thin oxide layer formed on the substrate over said source and drain regions.

13. The process of claim 1, 6 or 7, said step of defining borders on said substrate comprising selectively forming a field oxide layer.

* * * * *

UNITED STATES PATENT AND TRADEMARK OFFICE
CERTIFICATE OF CORRECTION

PATENT NO. : 4,348,802

DATED : September 14, 1982

INVENTOR(S) : TAKEHIDE SHIRATO

It is certified that error appears in the above-identified patent and that said Letters Patent is hereby corrected as shown below:

| | |
|---|---|
| Column 2, | line 26, "contacting" should be --contact--. |
| Column 4, | line 37, ", and;" should be --; and--; |
| | line 64, ", and;" should be --; and--. |
| Column 5, | line 2, "comprises" should be --comprising--. |
| Column 6, | line 20, delete "of"; |
| | line 51, "the" (first occurrence) should be --and the--. |
| Column 7, | line 35, delete "of". |
| Column 10, | line 14, "layer" should be --layer 32--; in the right hand column of the chart, "A" (all four occurrences) should be --Å--; |
| Column 11, | line 36, "portion" should be --portions--. |

Signed and Sealed this

Twenty-fifth Day of January 1983

[SEAL]

Attest:

GERALD J. MOSSINGHOFF

*Attesting Officer*  *Commissioner of Patents and Trademarks*